US008492171B2

(12) United States Patent
Deschenes et al.

(10) Patent No.: US 8,492,171 B2
(45) Date of Patent: Jul. 23, 2013

(54) TECHNIQUES AND STRUCTURES FOR TESTING INTEGRATED CIRCUITS IN FLIP-CHIP ASSEMBLIES

(75) Inventors: Michel Deschenes, Granby (CA); Marco Gauvin, Granby (CA); Eric Giguère, Granby (CA)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 13/187,562

(22) Filed: Jul. 21, 2011

(65) Prior Publication Data

US 2013/0020697 A1 Jan. 24, 2013

(51) Int. Cl.
*H01L 23/488* (2006.01)
*H01L 21/58* (2006.01)

(52) U.S. Cl.
USPC ............... 438/4; 438/108; 438/459; 438/615; 257/E21.503; 257/E21.511

(58) Field of Classification Search
USPC ........... 438/4, 108, 459, 615, 977, FOR. 343; 257/E21.503, E21.511
See application file for complete search history.

(56) References Cited

U.S. PATENT DOCUMENTS

| | | | |
|---|---|---|---|
| 5,220,200 A | 6/1993 | Blanton | |
| 5,790,377 A | 8/1998 | Schreiber et al. | |
| 6,002,178 A | 12/1999 | Lin | |
| 6,040,630 A | 3/2000 | Panchou et al. | |
| 6,329,722 B1 | 12/2001 | Shih et al. | |
| 6,911,624 B2 | 6/2005 | Koopmans | |
| 7,087,458 B2 | 8/2006 | Wang et al. | |
| 7,129,575 B1 | 10/2006 | Lin et al. | |
| 7,190,080 B1 | 3/2007 | Leu et al. | |
| 7,224,071 B2 | 5/2007 | Odegard | |
| 7,268,421 B1 | 9/2007 | Lin | |
| 7,505,284 B2 | 3/2009 | Offrein et al. | |
| 7,670,874 B2 | 3/2010 | Trezza | |
| 7,781,232 B2 | 8/2010 | Arvin et al. | |
| 7,811,863 B1 | 10/2010 | Lin et al. | |
| 2001/0019178 A1* | 9/2001 | Brofman et al. | 257/780 |
| 2005/0028361 A1 | 2/2005 | Yin et al. | |
| 2007/0052109 A1 | 3/2007 | Chen et al. | |
| 2007/0132107 A1* | 6/2007 | Wu | 257/778 |
| 2009/0184407 A1* | 7/2009 | Arvin et al. | 257/678 |

OTHER PUBLICATIONS

PCT International Search Report and Written Opinion, Application No. PCT/US2012/047099, Sep. 28, 2012.

(Continued)

*Primary Examiner* — George Fourson, III
(74) *Attorney, Agent, or Firm* — Nelson and Nelson; Daniel P. Nelson; Alexis V. Nelson (57) ABSTRACT

A method for rejoining an IC die, removed from an existing substrate, to a new substrate, is disclosed herein. In one embodiment, such a method includes grinding an existing substrate from an IC die to create a substantially planar surface exposing interconnects and surrounding underfill material. A new substrate is provided having electrically conductive pedestals protruding therefrom. The electrically conductive pedestals are positioned to align with the exposed interconnects and have a melting point substantially higher than the melting point of the interconnects. The method places the exposed interconnects in contact with the electrically conductive pedestals. The method then applies a reflow process to melt and electrically join the exposed interconnects with the electrically conductive pedestals. A structure produced by the method is also disclosed.

10 Claims, 9 Drawing Sheets

OTHER PUBLICATIONS

Wang, Tie, et. al., "Studies on a Novel Flip-Chip Interconnect Structure—Pillar Bump," Electronic Components and Technology Conference, 2001, pp. 945-949.

Tsai, Jui-Yun, "A Novel 20-100 μm Pitch IC-to-Package Interconnect and Assembly Process for Pb-free Solder, Copper or Gold Stud Bumps," Proceedings of the 56th Electronic Components and Technology Conference, 2006, pp. 263-268.

* cited by examiner

TECHNIQUES AND STRUCTURES FOR TESTING INTEGRATED CIRCUITS IN FLIP-CHIP ASSEMBLIES

BACKGROUND

1. Field of the Invention

This invention relates to semiconductor devices, and more specifically to techniques and structures for testing integrated circuits in flip-chip assemblies.

2. Background of the Invention

Failure analysis is the process of determining the cause of a failure, collecting and analyzing data related to the failure, and developing conclusions to eliminate or mitigate causes of the failure. In the semiconductor industry, conducting failure analysis for integrated circuits is essential to improving the quality and design of the integrated circuits, as well as the manufacturing processes used to produce the integrated circuits. Manufacturers of integrated circuits need to be made aware of weaknesses in their circuits and manufacturing processes in order to develop means for monitoring and eliminating such weaknesses.

Because integrated circuits are incorporated into a wide variety of different electronic packages, performing failure analysis on such integrated circuits can be challenging. For example, as is very common today, multiple integrated circuits, in the form of multiple flip-chip assemblies, may be mounted to a multi-chip module (MCM) substrate. To perform failure analysis for an integrated circuit mounted to such an MCM substrate, the integrated circuit die may be removed from the MCM substrate and attached to a single-chip module (SCM) which is more suitable for testing. However, creating a reliable connection between the integrated circuit die and the SCM substrate after it has been removed from the MCM substrate can be challenging.

One approach for removing an integrated circuit (IC) from an MCM substrate is to cut the MCM substrate around the IC die and grind away the remaining MCM substrate. This will expose the solder interconnects (e.g., C4 interconnects) along with the surrounding underfill material. Solder bumps may then be deposited on the SCM substrate to allow the IC die to be electrically joined to the substrate. Alternatively, solder bumps may be deposited over the interconnects of the IC die to allow the IC die to be electrically joined to the SCM substrate. Unfortunately, these techniques are unreliable as they may cause shorting between the interconnects of the IC die. This shorting may be the result of solder flowing by capillary action into the gap between the IC die and the SCM substrate during the reflow process.

In view of the foregoing, what are needed are improved techniques and structures for testing integrated circuits in flip-chip assemblies. Specifically, improved techniques and structures are needed to rejoin IC dies, removed from existing substrates such as MCM substrates, to new substrates such as SCM substrates.

SUMMARY

The invention has been developed in response to the present state of the art and, in particular, in response to the problems and needs in the art that have not yet been fully solved by current techniques and structures. Accordingly, the invention has been developed to provide techniques and structures for rejoining IC dies, removed from existing substrates such as MCM substrates, to new substrates such as SCM substrates. The features and advantages of the invention will become more fully apparent from the following description and appended claims, or may be learned by practice of the invention as set forth hereinafter.

Consistent with the foregoing, a method for rejoining an IC die, removed from an existing substrate, to a new substrate, is disclosed herein. In one embodiment, such a method includes grinding an existing substrate from an IC die to create a substantially planar surface exposing interconnects and surrounding underfill material. A new substrate is provided having electrically conductive pedestals protruding therefrom. The electrically conductive pedestals are positioned to align with the exposed interconnects and have a melting point substantially higher than the melting point of the interconnects. The method places the exposed interconnects in contact with the electrically conductive pedestals such that the electrically conductive pedestals create a controlled gap between the new substrate and the underfill material. The method then applies a reflow process to melt and electrically join the exposed interconnects with the electrically conductive pedestals.

In another aspect of the invention, a microelectronic assembly in accordance with the invention includes an IC die having interconnects bonded thereto. A first underfill layer, bonded to the IC die, surrounds the interconnects. The microelectronic assembly further includes a substrate having electrically conductive pedestals protruding therefrom. The electrically conductive pedestals have a melting point substantially higher than that of the interconnects. The electrically conductive pedestals align with and electrically connect to the interconnects. A second underfill layer surrounds the electrically conductive pedestals and separates the first underfill layer from the substrate.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1A:
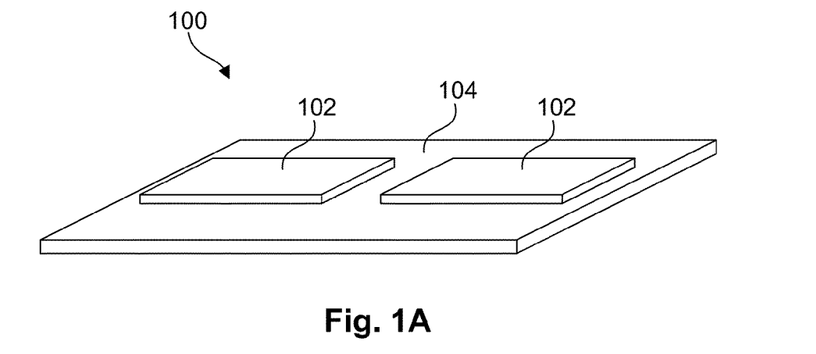
FIGS. 1A through 1D show one embodiment of a process for removing an IC die from an MCM substrate, and rejoining the IC die to an SCM substrate.

Referring to FIGS. 1A through 1D, one embodiment of a process for removing an IC die from an MCM substrate, and re-joining the IC die to an SCM substrate, is illustrated. As shown in FIG. 1A, a multi-chip module (MCM) 100 may include multiple IC dies 102 mounted to a common substrate 104, such as a multi-layer laminate structure 104. In certain embodiments, the entire MCM 100 may be referred to as a "chip," highlighting its integrated nature. Like other electronic components, IC dies 102 are subject to failure. However, because of the integrated nature of the MCM 100, testing or analyzing individual IC dies 102 that are mounted to the MCM 100 can be challenging. This is because it may be difficult to isolate a failed IC die 102 from other components on the substrate 104, or access interconnects or other connections of the failed IC die 102 to perform testing. To overcome these limitations, an IC die 102 may be removed from an MCM 100 and attached to a single-chip module (SCM) substrate 106 that is more suitable for testing and analysis.

Figure 1B:
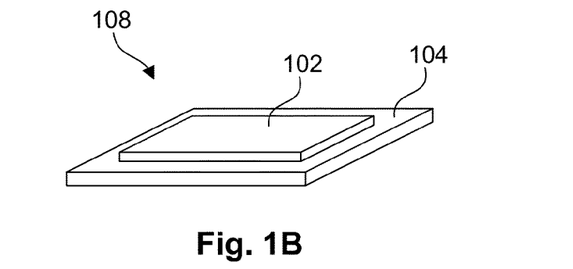

As shown in FIG. 1B, one approach for removing an IC die 102 from an MCM substrate 104 is to cut the IC die 102 from the substrate 104 (e.g., by cutting the substrate 104 immediately around the IC die 102). This will produce a structure 108 similar to that illustrated in FIG. 1B. A grinder may then be applied to the structure 108 to grind away the remaining substrate 104 and expose the underlying solder interconnects and underfill material. Alternatively, a hot die removal process may be used to melt the solder interconnects and break the underlying underfill material.

Once the IC die 102 has been removed from the MCM 100, the IC die 102 may be joined to a new SCM substrate 106. In certain cases, the SCM substrate 106 provides an interface with the IC die 102 that is more suitable for testing and/or analyzing the IC die 102. For example, the SCM substrate 106 may include connections or circuitry that is more suitable for coupling to diagnostic equipment.

In conventional implementations, to allow the IC die 102 to be electrically joined to the SCM substrate 106, solder bumps may be deposited on the SCM substrate 106. Such a process will be described in more detail in association with FIGS. 2A and 2B. Alternatively, solder bumps may be deposited on the IC die 102 (i.e., the IC die 102 may be "re-bumped") to allow the IC die 102 to be electrically joined to the SCM substrate 106. Unfortunately, these conventional techniques may be unreliable where underfill is present on the IC die 102, since they may produce electrical shorting between interconnects. This shorting may be the result of solder flowing by capillary action into the narrow gap between the underfill and the SCM substrate 106 during the reflow process. Such conventional techniques are also multi-step processes that may be expensive, time-consuming, and prone to defects.

As will be explained in more detail hereafter, in certain embodiments in accordance with the invention, the solder bumps may be replaced with electrically conductive pedestals 110, such as electrically conductive posts, studs, or pillars, which protrude from the SCM substrate 106. The electrically conductive pedestals 110 may be made of a material with a melting point substantially higher than the melting point of the solder interconnects (e.g., C4 interconnects) on the IC die 102. This will ensure that when a reflow process is applied to the single-chip module 112, only the solder interconnects on the IC die 102 will melt and reflow. This process will be described in more detail in association with FIGS. 3A through 3C. As will be shown in FIGS. 3A through 3C, the electrically conductive pedestals 110 create a more reliable connection between the IC die 102 and the SCM substrate 106 by maintaining additional separation between the IC die 102 and the SCM substrate 106, thereby preventing shorts between the solder interconnects and allowing introduction of new underfill.

Figure 1C:
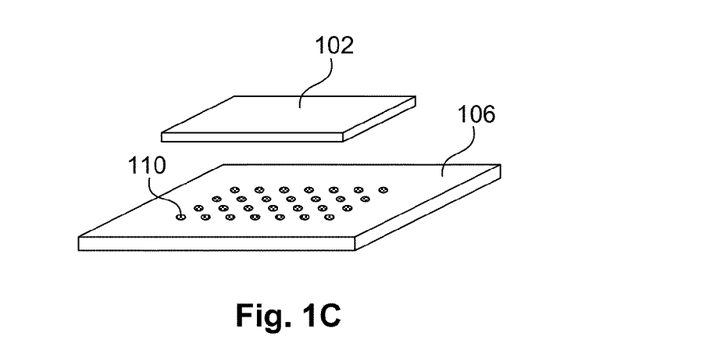
Figure 1D:
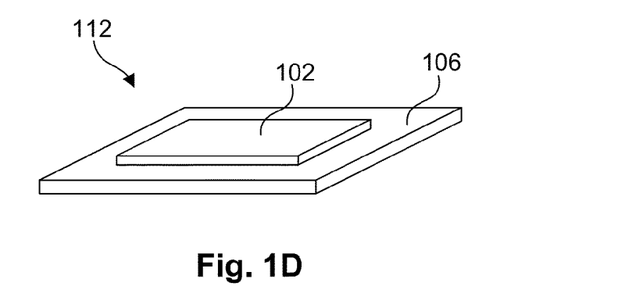

FIG. 1C shows the IC die 102 and SCM substrate 106 prior to joining the IC die 102 to the SCM substrate 106. FIG. 1D shows the single-chip module 112 after the IC die 102 has been joined to the SCM substrate 106.

Figure 2A:
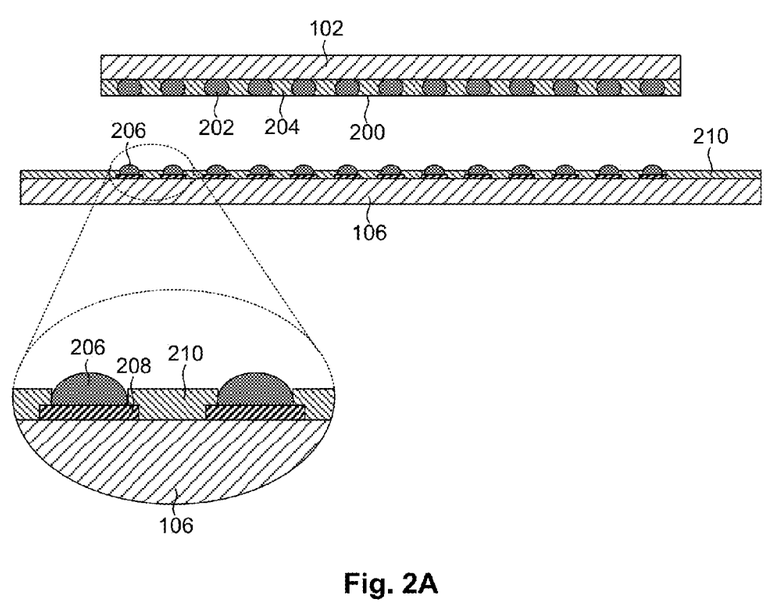
FIG. 2A is a cross-sectional side view showing a non-ideal technique and structure for joining an IC die, removed from an existing substrate, to a new substrate.

FIG. 2A is a cross-sectional side view showing an example of a conventional technique for joining an IC die 102 with underfill present to an SCM substrate 106. This technique is described to highlight differences with the improved technique, which will be described in association with FIGS. 3A through 3C. As shown, after an IC die 102 has been cut from an MCM substrate 104 and the remaining substrate 104 has been ground away, a substantially planar surface 200 may be created on the IC die 102. This planar surface 200 may expose the solder interconnects 202 as well as the surrounding underfill material 204.

In such a conventional technique, to enable the IC die 102 to be connected to an SCM substrate 106, solder bumps 206 (e.g., bumps 206 made of solder paste) may be deposited on flip-chip attach (FCA) pads 208 (e.g., copper FCA pads 208) or other electrically conductive elements 208 on the SCM substrate 106. Alternatively, the solder bumps 206 may be deposited onto the exposed solder interconnects 202 of the IC die 102 (a process referred to as "re-bumping"). The FCA pads 208 or other elements 208 may be exposed through a solder resist layer 210 on the substrate 106 and be electrically connected to circuitry such as conductive traces or wiring (not shown) embedded within the substrate 106.

To join the IC die 102 to the SCM substrate 106, the solder interconnects 202 may be placed in contact with the solder bumps 206. Alternatively, if the solder bumps 206 are initially attached to the solder interconnects 202, the solder bumps 206 may be placed in contact with the FCA pads 208. A reflow process may then be applied to the assembly. This will melt and re-solidify the solder interconnects 202 and solder bumps 206 to electrically join the IC die 102 to the SCM substrate 106. This process will create a structure similar to that illustrated in FIG. 2B.

Figure 2B:
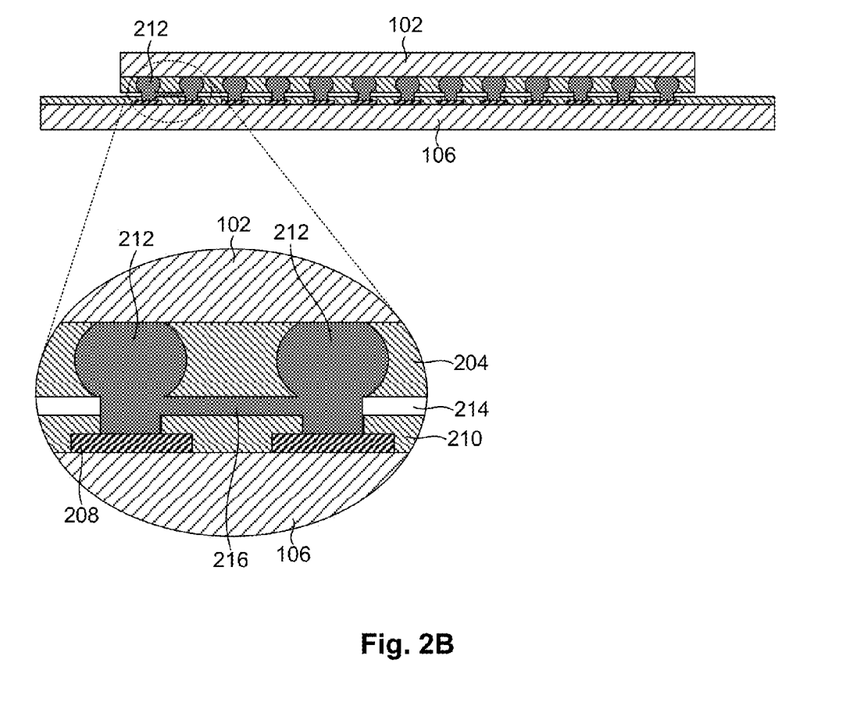
FIG. 2B is a cross-sectional side view showing a microelectronic assembly produced using the technique and structure of FIG. 2A.

As shown in FIG. 2B, after a reflow process is applied, the solder interconnects 202 and solder bumps 206 will melt and re-solidify to form solder joints 212 like those illustrated in FIG. 2B. Because existing underfill is present on the IC die 102, a narrow gap 214 (typically in the range of twenty to twenty-five microns) is created between the underfill 204 and the SCM substrate 106. Because of the narrowness of the gap 214, melted solder may be drawn into the gap 214 by capillary action during the reflow process. This can create undesired electrical bridges 216 between the solder connections 212, as illustrated in FIG. 2B. Such shorts will produce defects that may render the single-chip module 112 unusable for its intended purpose. The narrowness of the gap 214 between the IC die 102 and the SCM substrate 106 may also prevent introduction of new underfill material into the gap 214, depending on the grain size and/or viscosity of the new underfill material.

Figure 3A:
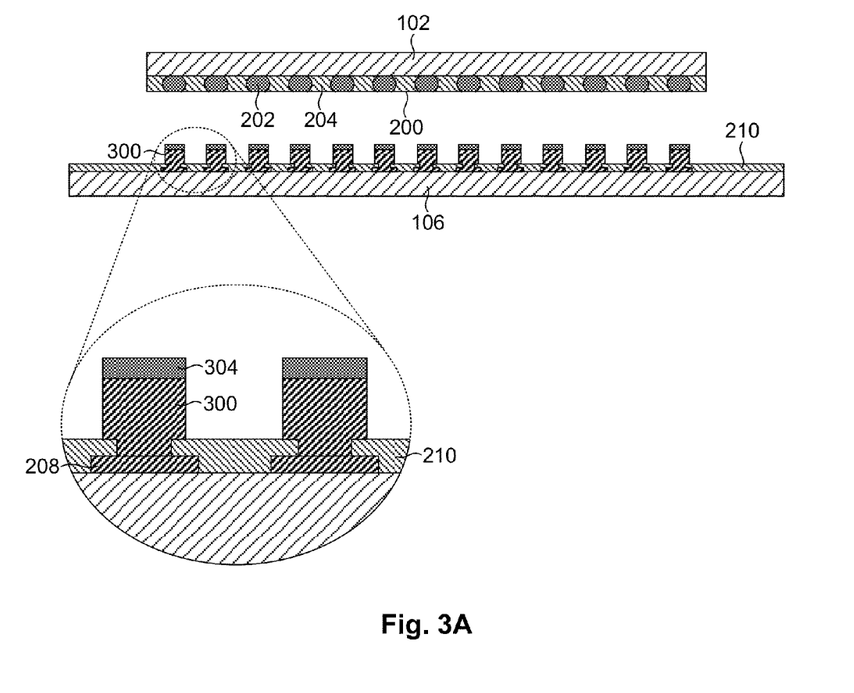
FIG. 3A is a cross-sectional side view showing an improved technique and structure for joining an IC die, removed from an existing substrate, to a new substrate.

FIG. 3A is cross-sectional side view showing an improved technique for joining an IC die 102 with underfill 204 present to an SCM substrate 106. Like the previous example, the IC die 102 may be initially removed from an MCM substrate 104 and the remaining MCM substrate 104 may be ground away to provide a substantially planar surface 200. The planar surface 200 exposes the solder interconnects 202 and the surrounding underfill material 204.

Instead of depositing solder bumps 206 on the SCM substrate 106 or the solder interconnects 202, as was performed in the previous example, the SCM substrate 106 may be provided with electrically conductive pedestals 300 protruding therefrom. These electrically conductive pedestals 300 may align with the solder interconnects 202 and protrude a specified distance (e.g., at least thirty microns and ideally at least forty microns) relative to the solder resister layer 210. In certain embodiments, the electrically conductive pedestals 300 are embodied as electrically conductive posts, studs, or pillars extending from the SCM substrate 106. The electrically conductive pedestals 300 may extend from and electrically connect to the conductive pads 208, which may in turn electrically connect to circuitry embedded within the substrate 106. Among other benefits, the electrically conductive pedestals 300 may create a larger controlled gap between the underfill layer 204 and the solder resist layer 210. As will be explained in association with FIGS. 3B and 3C, this larger controlled gap may prevent shorting as well as provide space to introduce new underfill material.

As previously mentioned, the electrically conductive pedestals 300 may be made from an electrically conductive material with a melting point substantially higher than the melting point of the solder interconnects 202. This will ensure that the electrically conductive pedestals 300 are stable (i.e. will not melt) during a reflow process. In one example, the solder interconnects 202 are made from a lead-based or lead-free, tin-based solder, and the electrically conductive pedestals 300 are made from copper. In certain embodiments, tin plating 304 or other solder plating 304 may be applied on top of the copper pedestals 300. In certain embodiments, the copper pedestals 300 are produced using a copper plating process (on top of the copper pads 208) after the solder resister layer 210 is deposited on the substrate 106. Since the copper has a higher melting point than lead- or tin-based solder, a reflow process may be applied that melts the solder interconnects 202 and plating material 304 without melting the electrically conductive pedestals 300.

The materials presented above (i.e., tin, copper, etc.) for the interconnects 202, pedestals 300, plating 304, and pads 208 are provided only by way of example and are not intended to be limiting. Indeed, the techniques and structures presented herein may be used with a wide variety of materials or combinations of materials, including materials not specifically named herein.

To join the IC die 102 to the SCM substrate 106 using the structure of FIG. 3A, the solder interconnects 202 may be placed in contact with the plating layer 304 on the electrically conductive pedestals 300. A reflow process may then be applied to the assembly. This will melt and re-solidify the solder interconnects 202 and plating material 304 to join the solder interconnects 202 to the electrically conductive pedestals 300. This will create a structure similar to that illustrated in FIG. 3B.

Figure 3B:
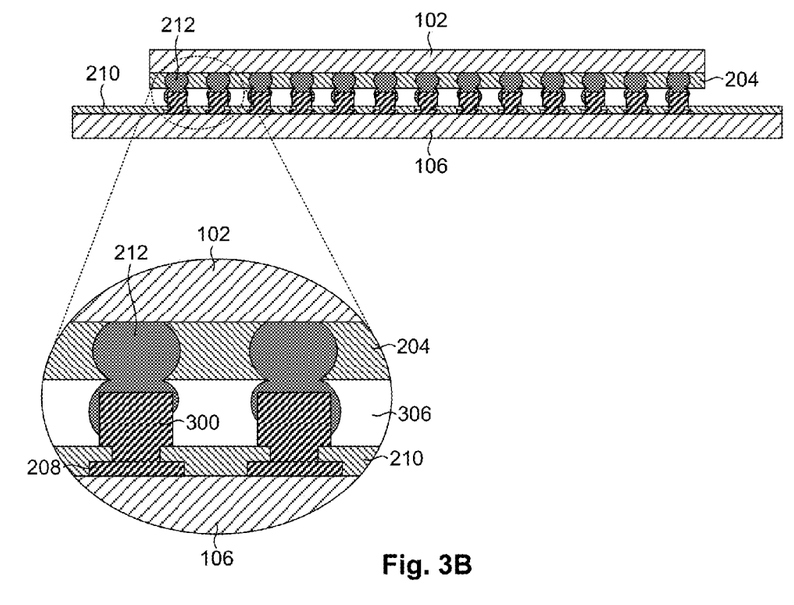
FIG. 3B is a cross-sectional side view showing a microelectronic assembly produced using the technique and structure of FIG. 3A.

As shown in FIG. 3B, after a reflow process has been applied, the solder interconnects 202 and plating material 304 will melt and re-solidify to form the solder connections 212. Because of the larger controlled gap 306 between the IC die 102 and the SCM substrate 106 as well as potential attraction between the pedestal material (e.g., copper) and the solder (e.g., tin), the molten solder will flow around and cling to the electrically conductive pedestals 300. The larger controlled gap 306 will reduce capillary action that may otherwise cause the solder to flow into the gap. Thus, the solder from each interconnect 202 and corresponding plating layer 304 will cling to the top and sides of the corresponding electrically conductive pedestal 300. This will reduce electrical shorts and increase the reliability of the single-chip module 112.

Figure 3C:
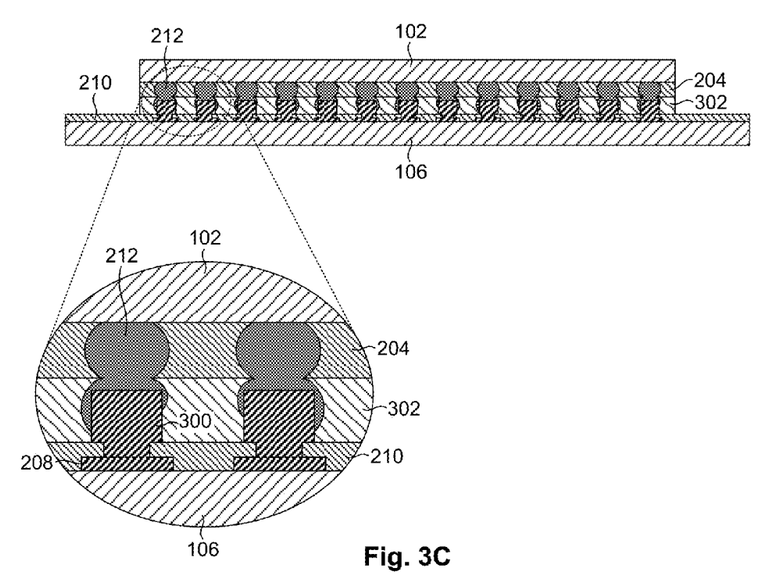
FIG. 3C is a cross-sectional side view showing a microelectronic assembly produced using the technique and structure of FIG. 3A, after the controlled gap between the IC die and the substrate has been underfilled.

The larger controlled gap 306 between the IC die 102 and the SCM substrate 106 may also be underfilled with an electrically-insulating adhesive 302, such as an electrically-insulating epoxy 302, as illustrated in FIG. 3C. Among other benefits, the underfill 302 may provide additional insulation between the solder connections 212, create a stronger mechanical connection between the IC die 102 and the SCM substrate 106, provide a heat bridge between the IC die 102 and the SCM substrate 106, and ensure that the solder connections 212 are not stressed due to differential heating between the IC die 102 and the SCM substrate 106.

Figure 4:
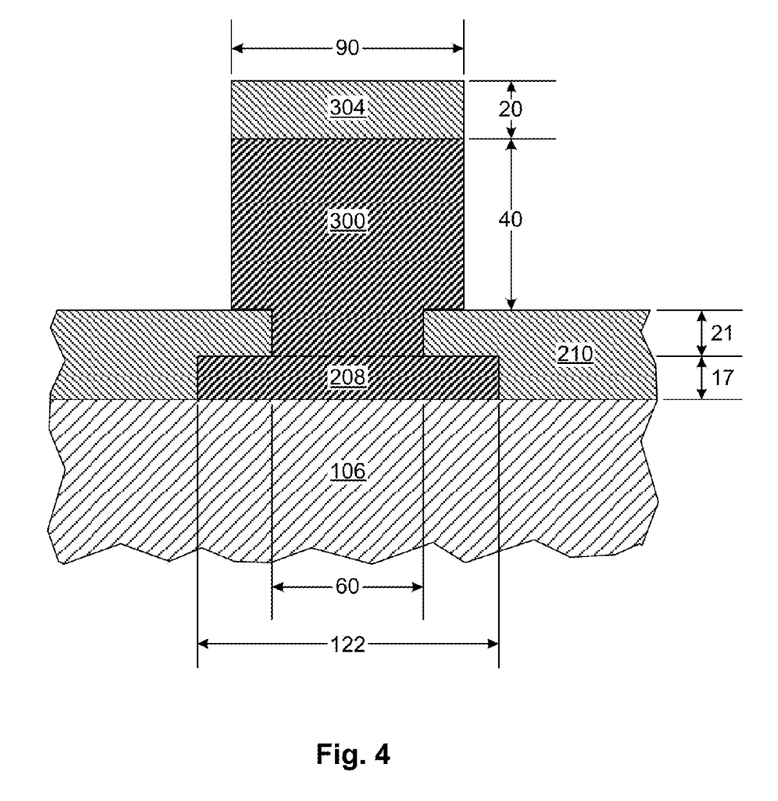
FIG. 4 is a cross-sectional side view showing one example of dimensions for the electrically conductive pedestals protruding from the substrate.

Referring to FIG. 4, the electrically conductive pedestals 300 may be sized to provide the above-stated benefits. FIG. 4 shows the dimensions (in microns) of an electrically conductive copper pedestal 300, tin plating 304, copper pad 208, and solder resist layer 210 that has been implemented by the present inventors. These dimensions are provided by way of example and are not intended to be limiting. In the illustrated embodiment, the height of the copper pedestal 300 is approximately forty microns relative to the top of the solder resister layer 210. The tin plating material 304 is approximately twenty microns thick. After the reflow process has melted and re-solidified the solder interconnects 202 and plating material 304, a controlled gap 306 of about forty to forty-five microns will be created between the underfill layer 204 and the solder resister layer 210. In certain embodiments, the controlled gap 306 is at least thirty microns and ideally at least forty microns. The present inventors have found that a gap 306 of forty microns is sufficient to prevent the flow of solder along the gap 306 between the underfill layer 204 and the solder resist layer 210, thereby preventing electrical shorting. This gap 306 is also sufficient to accommodate new underfill material 302 to further insulate the solder connections 212.

Figure 5:
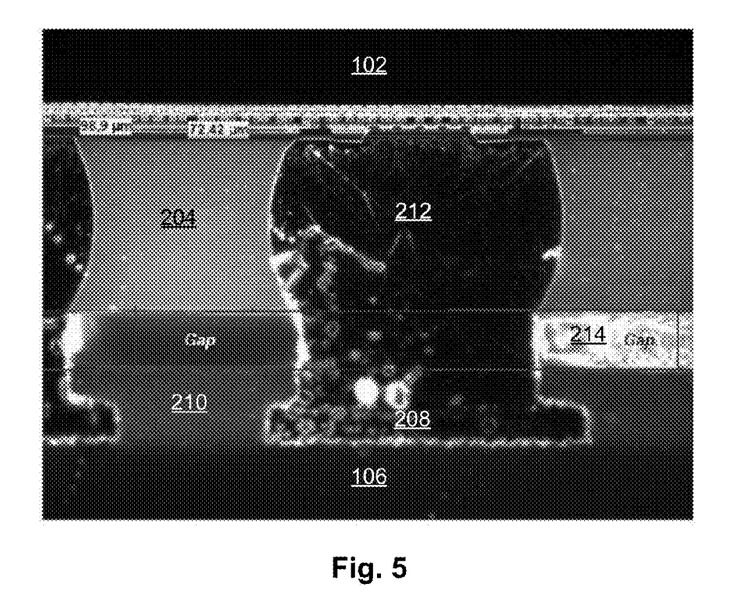
FIG. 5 is an image showing an actual solder interconnect and copper pad that have been joined using the non-ideal technique and structure described in association with FIGS. 2A and 2B.

Referring to FIG. 5, an image showing a cross-section of a solder joint 212 produced using the non-ideal technique described in association with FIGS. 2A and 2B is illustrated. The image was produced using dark field optical imaging. In this example, the solder joint 212 was created by applying a reflow process to a tin-based solder interconnect 202 and a tin-based solder bump 206 on a copper FCA pad 208. The area 212 represents the solder joint 212 created by the union of the solder bump 206 and the solder interconnect 202. The bottom area 208 represents the copper FCA pad 208. As can be observed, a narrow gap 214 of approximately twenty-five microns was present between the IC die underfill layer 204 and the solder resist layer 210. This narrow gap 214 produced a capillary effect on the molten solder and was too narrow to accommodate new underfill material. The light-colored area 214 is indicative of solder that flowed into the gap 214, potentially producing a conductive bridge (i.e., a short) between solder connections 212.

Figure 6A:
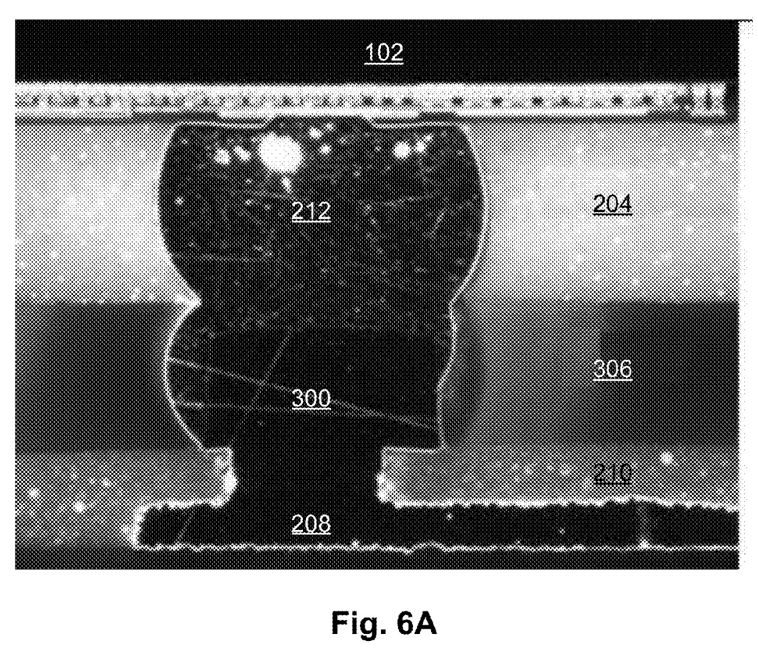
FIGS. 6A and 6B are images showing an actual solder interconnect and copper pedestal that have been joined using the improved technique and structure described in association with FIGS. 3A through 3C.
Figure 6B:
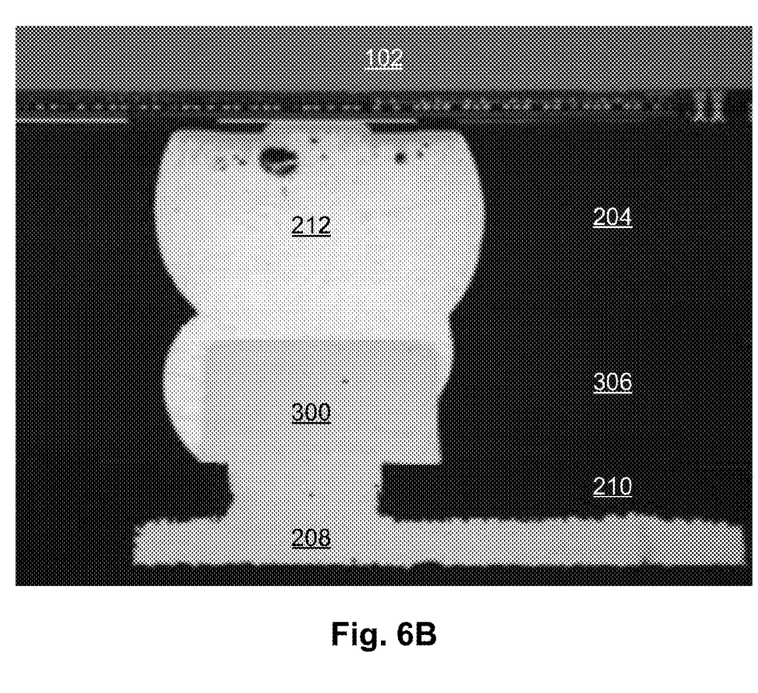

Referring to FIGS. 6A and 6B, several images showing cross-sections of a solder joint 212 produced using the techniques described in association with FIGS. 3A through 3C are illustrated. In this example, the solder joint 212 was created by applying a reflow process to a tin-based solder interconnect 202 placed against a copper pedestal 300 plated with tin. The area 212 is the solder connection 212 which represents the union of the tin-based solder interconnect 202 and the tin plating material 304. The area 300 is the copper pedestal 300 which is attached to a copper pad 208. The area 204 is the underfill material on the IC die 102 and the area 210 is the solder resist layer 210 on the SCM substrate 106. The area 306 is the controlled gap 306 between the underfill material 204 and the solder resist layer 210. In this example, the controlled gap 306 is approximately forty-five microns wide. As can be observed, instead of flowing into the controlled gap 306, the solder from the solder interconnect 202 and tin plating 304 surrounds and clings to the copper pedestal 300, thereby preventing electrical shorts with other solder connections 212. The controlled gap 306 also provides sufficient space to introduce a new underfill material.

As mentioned above, the conductive pedestals 300 provide various advantages when remounting an IC die 102 to an SCM substrate 106. Not only do the electrically conductive pedestals 300 reduce shorting and provide a more controlled gap to accommodate new underfill material, the electrically conductive pedestals 300 may also reduce the uniformity required for the planar surface 200 when joining the IC die 102 and SCM substrate 106. Perhaps more importantly, the electrically conductive pedestals 300 reduce the number of process steps required to remount the IC die 102 to an SCM substrate 106 compared to conventional processes (e.g., there is no need to "re-bump" the IC die 102 or SCM substrate 106). This, in turn, will reduce the time and cost required to perform diagnostics on IC dies 102.

The techniques and structures disclosed herein may be embodied in other specific forms without departing from their spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for rejoining an IC die, removed from an existing substrate, to a new substrate, the method comprising:
   grinding an existing substrate from an IC die, thereby creating a substantially planar surface on the IC die exposing interconnects and surrounding underfill material;
   providing a new substrate comprising a plurality of electrically conductive pedestals protruding therefrom, the electrically conductive pedestals having a melting point substantially higher than a melting point of the interconnects, the electrically conductive pedestals being positioned such as to align with the exposed interconnects;
   placing the exposed interconnects in contact with the electrically conductive pedestals, the electrically conductive pedestals creating a controlled gap between the new substrate and the underfill material; and
   applying a reflow process to melt and electrically join the exposed interconnects with the electrically conductive pedestals.

2. The method of claim 1, wherein the electrically conductive pedestals are copper pedestals.

3. The method of claim 2, wherein the copper pedestals are overlaid with tin.

4. The method of claim 1, wherein the electrically conductive pedestals are one of electrically conductive posts, studs and pillars.

5. The method of claim 4, wherein the height of the electrically conductive pedestals relative to the new substrate is at least thirty microns.

6. The method of claim 5, wherein the height of the electrically conductive pedestals relative to the new substrate is at least forty microns.

7. The method of claim 1, further comprising underfilling the IC die by filling the controlled gap with an electrically-insulating material.

8. The method of claim 1, wherein the interconnects are C4 interconnects.

9. The method of claim 1, wherein the existing substrate is a multi-component module (MCM) substrate.

10. The method of claim 1, wherein the new substrate is a single-component module (SCM) substrate.

* * * * *